United States Patent
Chang (10) Patent No.: US 11,956,595 B2
(45) Date of Patent: Apr. 9, 2024

(54) ELECTRO-MECHANICAL FILM SPEAKER DEVICE

(71) Applicant: ANPEC ELECTRONICS CORPORATION, Hsinchu (TW)

(72) Inventor: Ming-Hung Chang, Hsinchu (TW)

(73) Assignee: ANPEC ELECTRONICS CORPORATION, Hsinchu (TW)

( * ) Notice: Subject to any disclaimer, the term of this patent is extended or adjusted under 35 U.S.C. 154(b) by 317 days.

(21) Appl. No.: 17/580,576

(22) Filed: Jan. 20, 2022

(65) Prior Publication Data

US 2023/0104251 A1  Apr. 6, 2023

(30) Foreign Application Priority Data

Oct. 4, 2021 (TW) ................. 110136813

(51) Int. Cl.
*H04R 19/02* (2006.01)
*H03F 3/45* (2006.01)
*H04R 3/04* (2006.01)

(52) U.S. Cl.
CPC ......... *H04R 19/02* (2013.01); *H03F 3/45475* (2013.01); *H04R 3/04* (2013.01); *H03F 2200/171* (2013.01); *H04R 2201/003* (2013.01)

(58) Field of Classification Search
CPC .... H04R 19/02; H04R 3/04; H04R 2201/003; H03F 3/45475; H03F 2200/171
See application file for complete search history.

(56) References Cited

U.S. PATENT DOCUMENTS

| | | | | |
|---|---|---|---|---|
| 7,466,829 B1* | 12/2008 | Anderson | .............. | H03G 7/002 |
| | | | | 381/103 |
| 7,683,720 B1* | 3/2010 | Yehui | .................. | H03F 3/45192 |
| | | | | 30/304 |
| 2014/0188417 A1* | 7/2014 | Dong | .................. | A61B 5/7225 |
| | | | | 702/65 |
| 2019/0103839 A1* | 4/2019 | Lee | ......................... | H03F 3/193 |

* cited by examiner

*Primary Examiner* — Carolyn R Edwards
*Assistant Examiner* — Julie X Dang
(74) *Attorney, Agent, or Firm* — Li & Cai Intellectual Property Office (57) ABSTRACT

A micro electro-mechanical film speaker device is provided. A signal input terminal of a signal amplifier circuit is connected to an external input circuit. A second output terminal of the signal amplifier circuit is connected to a negative terminal of a micro electro-mechanical film speaker. A first terminal of a first high-pass filter is connected to a first output terminal of the signal amplifier circuit. A second terminal of the first high-pass filter is connected to a positive terminal of the micro electro-mechanical film speaker. A first terminal of a second high-pass filter is connected to a feedback terminal of the signal amplifier circuit. A second terminal of the second high-pass filter is connected to the positive terminal of the micro electro-mechanical film speaker.

12 Claims, 5 Drawing Sheets

FIG. 6 ural film speaker device.

CROSS-REFERENCE TO RELATED PATENT APPLICATION

This application claims the benefit of priority to Taiwan Patent Application No. 110136813, filed on Oct. 4, 2021. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a speaker, and more particularly to a micro electro-mechanical film speaker device.

BACKGROUND OF THE DISCLOSURE

An inverse piezoelectric effect occurs in a micro electro-mechanical film speaker made of a piezoelectric material. Therefore, when a voltage is applied to the micro electro-mechanical film speaker, an electric dipole moment of the micro electro-mechanical film speaker is stretched. The piezoelectric material is stretched along a direction of an electric field against stretch in the electric dipole moment of the micro electro-mechanical film speaker. As a result, electrical energy is converted into mechanical energy. The mechanical energy pushes a diaphragm such that sound pressure is generated.

A DC bias voltage must be applied to a film of the micro electro-mechanical film speaker such that two sides of the film are pulled away from each other such that an appropriate distance is between the two sides of the film. Under this condition, when an AC signal is inputted to the micro electro-mechanical film speaker, a vibration amplitude that the film of the micro electro-mechanical film speaker vibrates forward is consistent with and is linear with respect with to a vibration amplitude that the film vibrates backward. As a result, distortion in the AC signal is reduced.

The micro electro-mechanical film speaker can be regarded as a capacitor in terms of electrical properties. However, a capacitance of the micro electro-mechanical film speaker changes with a change in the voltage applied to the two sides of the film of the micro electro-mechanical film speaker. Therefore, capacitance characteristics of the micro electro-mechanical film speaker changes with changes in the DC bias voltage and the AC signal.

The capacitance of the micro electro-mechanical film speaker and a capacitance of a driver circuit of the micro electro-mechanical film speaker depend on voltages of two terminals of the film. However, the micro electro-mechanical film speaker and the driver circuit are made of different materials. Therefore, a change in the capacitance of the micro electro-mechanical film speaker is different from a change in the capacitance of the driver circuit. As a result, serious distortion occurs in signals at the two terminals of the film.

SUMMARY OF THE DISCLOSURE

In response to the above-referenced technical inadequacies, the present disclosure provides a micro electro-mechanical film speaker device. The micro electro-mechanical film speaker device includes a micro electro-mechanical film speaker, a signal amplifier circuit, a first high-pass filter, and a second high-pass filter. The signal amplifier circuit has a signal input terminal, a first output terminal, a second output terminal and a feedback terminal. The signal input terminal of the signal amplifier circuit is connected to an external input circuit. The second output terminal of the signal amplifier circuit is connected to a negative terminal of the micro electro-mechanical film speaker. The signal amplifier circuit is configured to amplify an alternating current (AC) input signal from the external input circuit to output a first amplified signal through the first output terminal of the signal amplifier circuit. The signal amplifier circuit outputs a second amplified signal to the negative terminal of the micro electro-mechanical film speaker through the second output terminal of the signal amplifier circuit. A first terminal of the first high-pass filter is connected to the first output terminal of the signal amplifier circuit. A second terminal of the first high-pass filter is connected to a positive terminal of the micro electro-mechanical film speaker. The first high-pass filter is configured to filter the first amplified signal to output a first filtered signal to the micro electro-mechanical film speaker. A first terminal of the second high-pass filter is connected to the feedback terminal of the signal amplifier circuit. A second terminal of the second high-pass filter is connected to the positive terminal of the micro electro-mechanical film speaker. The second high-pass filter is configured to filter the first filtered signal to output a second filtered signal to the feedback terminal of the signal amplifier circuit.

In certain embodiments, the micro electro-mechanical film speaker device further includes a direct current (DC) bias generator. The DC bias generator is connected to the positive terminal of the micro electro-mechanical film speaker. The DC bias generator is configured to output a DC bias voltage to the positive terminal of the micro electro-mechanical film speaker such that a difference is between a voltage of the positive terminal of the micro electro-mechanical film speaker and a voltage of the negative terminal of the micro electro-mechanical film speaker.

In certain embodiments, the signal amplifier circuit includes: a first input resistor, a second input resistor, an operational amplifier, a first feedback resistor, and a second feedback resistor. A first terminal of the first input resistor is connected to the external input circuit. The signal input terminal of the signal amplifier circuit includes the first terminal of the first input resistor. A first terminal of the second input resistor is connected to the external input circuit. The signal input terminal of the signal amplifier circuit includes the first terminal of the second input resistor. A first input terminal of the operational amplifier is connected to a second terminal of the first input resistor. A second input terminal of the operational amplifier is connected to a second terminal of the second input resistor. The first output terminal of the operational amplifier is connected to the first terminal of the first high-pass filter. The second output terminal of the operational amplifier is connected to the negative terminal of the micro electro-mechanical film speaker. A first terminal of the first feedback resistor is connected to the first input terminal of the operational amplifier. A second terminal of the first feedback resistor is connected to the first terminal of the second high-pass filter through the feedback terminal. A first terminal of the second feedback resistor is connected to the second input terminal of the operational amplifier. A second terminal of the second feedback resistor is connected to the second output terminal of the operational amplifier.

In certain embodiments, the first high-pass filter includes an output capacitor. A first terminal of the output capacitor is connected to the first output terminal of the operational amplifier. A second terminal of the output capacitor is connected to the positive terminal of the micro electro-mechanical film speaker.

In certain embodiments, the second high-pass filter includes a feedback capacitor. A first terminal of the feedback capacitor is connected to the second terminal of the first feedback resistor. A second terminal of the feedback capacitor is connected to the positive terminal of the micro electro-mechanical film speaker.

In certain embodiments, a common mode bias voltage of a signal outputted by the first output terminal of the operational amplifier is the same as that of a signal outputted by the second output terminal of the operational amplifier.

In certain embodiments, the common mode bias voltage is lower than a positive power supply voltage received by a positive power terminal of the operational amplifier. The common mode bias voltage is higher than a negative power supply voltage received by a negative power terminal of the operational amplifier.

In certain embodiments, a third input terminal of the operational amplifier receives the common mode bias voltage.

In certain embodiments, the common mode bias voltage is half a sum of the positive power supply voltage and the negative power supply voltage.

In certain embodiments, the DC bias voltage generator determines the DC bias voltage according to the common mode bias voltage and then outputs the DC bias voltage.

In certain embodiments, the DC bias voltage outputted by the DC bias voltage generator is equal to a sum of the common mode bias voltage and a first voltage. A difference between a voltage of the positive terminal of the micro electro-mechanical film speaker and a voltage of the negative terminal of the micro electro-mechanical film speaker is a constant value that is equal to the first voltage.

In certain embodiments, the DC bias voltage generator adjusts the first voltage according to characteristics of the micro electro-mechanical film speaker.

As described above, the present disclosure provides the micro electro-mechanical film speaker device, which has the following characteristics:

voltages of two terminals of the micro electro-mechanical film speaker are feedbacked and distortion in the signals of the micro electro-mechanical film speaker device is effectively improved based on the feedbacked voltage;

the signals feedbacked from the two terminals of the micro electro-mechanical film speaker is amplified by a constant gain, the signals are not attenuated by a voltage driver circuit, and thus a capacitance of the output capacitor included in the first high-pass filter does not need to be much larger than a capacitance of the micro electro-mechanical film speaker, thereby reducing a size of the output capacitor;

the second feedback capacitor included in the second high-pass filter filters the DC bias voltages and only allows the AC signal to be transmitted to the positive terminal of the micro electro-mechanical film speaker; and the DC bias voltage is determined according to the common mode bias voltage and provided to the positive terminal of the micro electro-mechanical film speaker such that the DC bias voltage between the two terminals of the micro electro-mechanical film speaker is constant.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Figure 1:
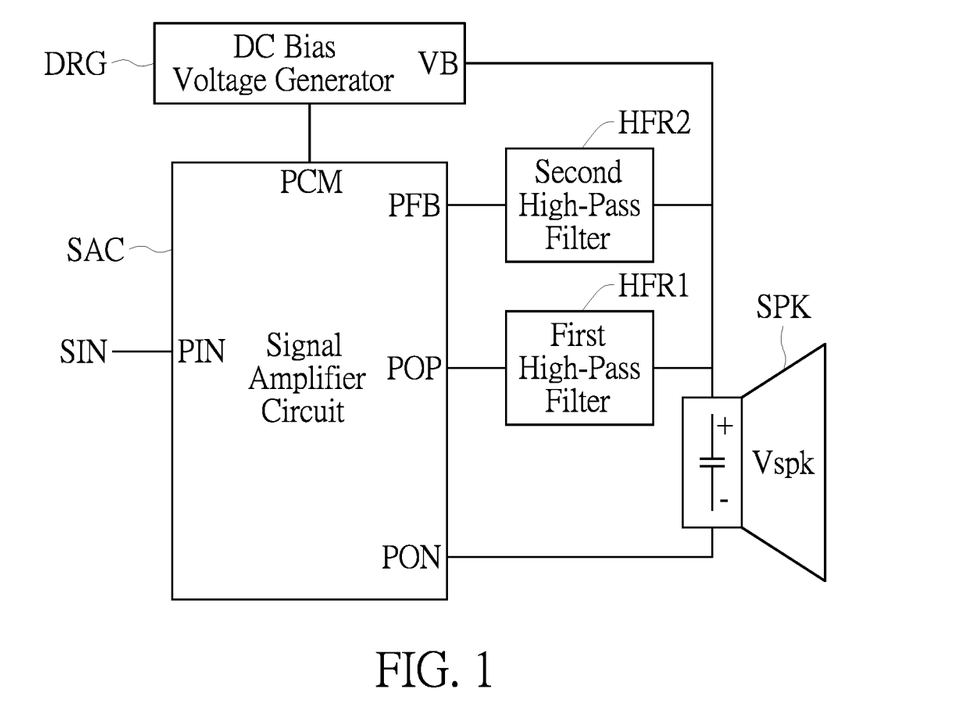
FIG. 1 is a circuit diagram of a micro electro-mechanical film speaker device of an embodiment of the present disclosure.

Reference is made to FIG. 1, which is a circuit diagram of a micro electro-mechanical film speaker device of an embodiment of the present disclosure.

The micro electro-mechanical film speaker device of the embodiment of the present disclosure may include a micro electro-mechanical film speaker SPK, a signal amplifier circuit SAC, a first high-pass filter HFR1 and a second high-pass filter HFR2 as shown in FIG. 1.

The signal amplifier circuit SAC may have a signal input terminal PIN, a first output terminal POP, a second output terminal PON, a feedback terminal PFB and a common mode terminal PCM. The signal input terminal PIN of the signal amplifier circuit SAC may be connected to an external input circuit (not shown in figures). The external input circuit provides an alternating current (AC) input signal SIN. The signal input terminal PIN of the signal amplifier circuit SAC may receive the AC input signal SIN from the external input circuit.

The first output terminal POP of the signal amplifier circuit SAC may be connected to a first terminal of the first high-pass filter HFR1. The signal amplifier circuit SAC may amplify the AC input signal SIN from the external input circuit to output a first amplified signal. The first output terminal POP of the signal amplifier circuit SAC may output the first amplified signal to the first high-pass filter HFR1.

A second terminal of the first high-pass filter HFR1 may be connected to a positive terminal of the micro electro-mechanical film speaker SPK. The first high-pass filter HFR1 may filter the first amplified signal from the first output terminal POP of the signal amplifier circuit SAC to output a first filtered signal to the positive terminal of the micro electro-mechanical film speaker SPK.

A first terminal of the second high-pass filter HFR2 may be connected to the feedback terminal PFB of the signal amplifier circuit SAC. A second terminal of the second high-pass filter HFR2 may be connected to the positive terminal of the micro electro-mechanical film speaker SPK. The second high-pass filter HFR2 may filter the first filtered signal from the first high-pass filter HFR1 to output a second filtered signal to the feedback terminal PFB of the signal amplifier circuit SAC.

The second output terminal PON of the operational amplifier OPA may be connected to a negative terminal of the micro electro-mechanical film speaker SPK. The second output terminal PON of the operational amplifier OPA may output a second amplified signal to the negative terminal of the micro electro-mechanical film speaker SPK.

Figure 2:
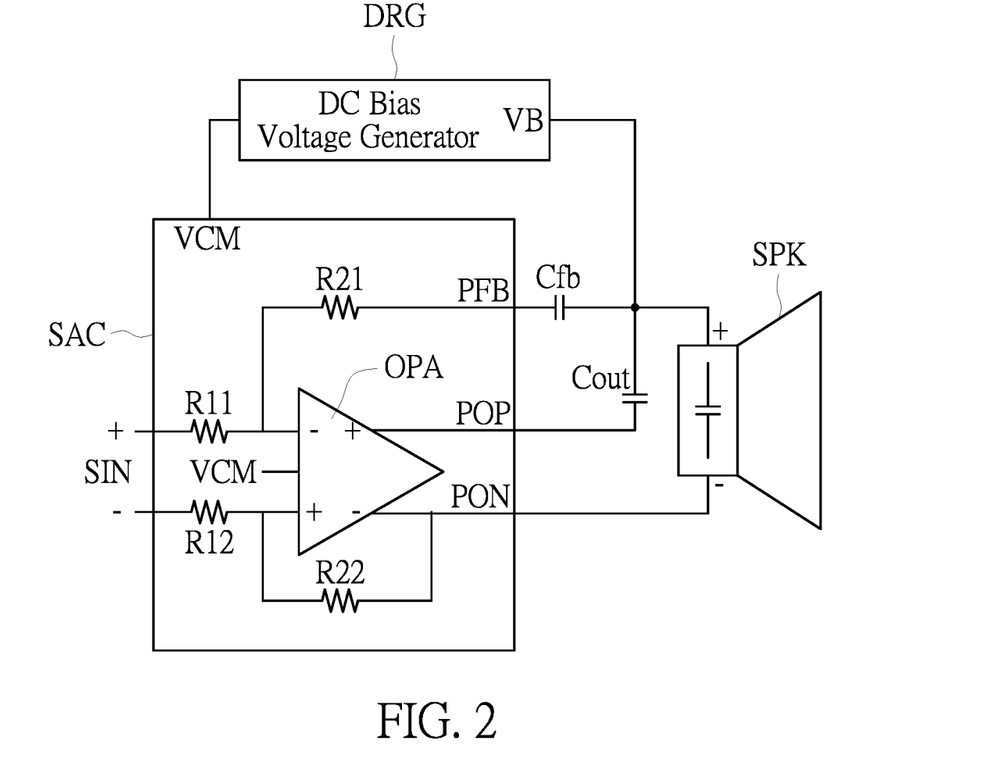
FIG. 2 is a circuit diagram of the micro electro-mechanical film speaker device of the embodiment of the present disclosure.
Figure 3:
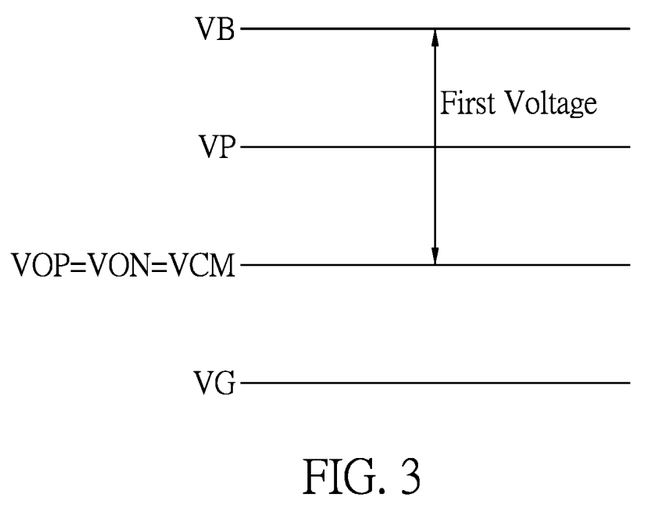
FIG. 3 is a schematic diagram of voltages of the micro electro-mechanical film speaker device of the embodiment of the present disclosure.
Figure 4:
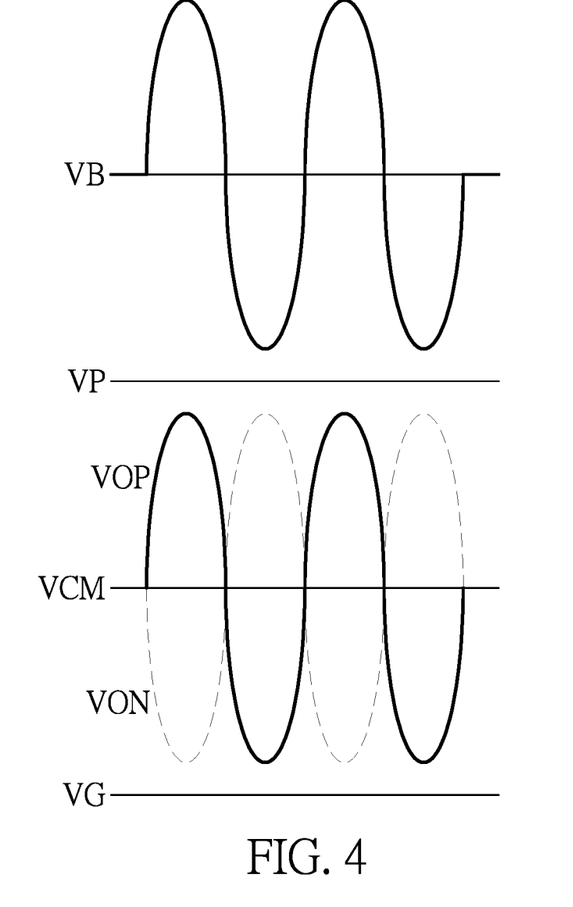
FIG. 4 is a waveform diagram of the micro electro-mechanical film speaker device of the embodiment of the present disclosure.

Reference is made to FIGS. 2 to 4, in which FIG. 2 is a circuit diagram of the micro electro-mechanical film speaker device of the embodiment of the present disclosure, FIG. 3 is a schematic diagram of voltages of the micro electro-mechanical film speaker device of the embodiment of the present disclosure, and FIG. 4 is a waveform diagram of the micro electro-mechanical film speaker device of the embodiment of the present disclosure.

As shown in FIG. 2, the signal amplifier circuit SAC of the embodiment of the present disclosure may include a first input resistor R11, a second input resistor R12, an operational amplifier OPA, a first feedback resistor R21 and a second feedback resistor R22.

A first terminal of the first input resistor R11 may be connected to the external input circuit (not shown in figures) and receive the AC input signal SIN from the external input circuit. The signal input terminal PIN of the signal amplifier circuit SAC may include the first terminal of the first input resistor R11.

A first terminal of the second input resistor R12 may be connected to the external input circuit (not shown in figures) and receive the AC input signal SIN from the external input circuit. The signal input terminal PIN of the signal amplifier circuit SAC may include the first terminal of the second input resistor R12. A resistance of the first input resistor Ru is equal to a resistance of the second input resistor R12.

A first input terminal (such as an inverting input terminal) of the operational amplifier OPA may be connected to a second terminal of the first input resistor R11. A second input terminal (such as a non-inverting input terminal) of the operational amplifier OPA may be connected to a second terminal of the second input resistor R12. The first output terminal POP of the operational amplifier OPA may be connected to a first terminal of an output capacitor Cout included in the first high-pass filter HFR1. That is, the first output terminal POP of the operational amplifier OPA may be connected to the first terminal of the first high-pass filter HFR1 as described above. A second terminal of the output capacitor Cout may be connected to the positive terminal of the micro electro-mechanical film speaker SPK. The second output terminal PON of the operational amplifier OPA may be connected to the negative terminal of the micro electro-mechanical film speaker SPK.

If necessary, the micro electro-mechanical film speaker device of the embodiment of the present disclosure may further include a direct current (DC) bias generator DRG. The DC bias voltage generator DRG may be connected to the positive terminal of the micro electro-mechanical film speaker SPK. The DC bias voltage generator DRG may output a DC bias voltage VB shown in FIGS. 3 and 4 to the positive terminal of the micro electro-mechanical film speaker SPK such that a difference is between a voltage of the positive terminal of the micro electro-mechanical film speaker SPK and a voltage of the negative terminal of the micro electro-mechanical film speaker SPK.

If necessary, the DC bias voltage generator may be connected to the common mode terminal PCM of the signal amplifier circuit SAC. The DC bias voltage generator DRG may determine a value of the DC bias voltage VB according to a common mode bias voltage VCM of the signal amplifier circuit SAC and then output the DC bias voltage VB to the positive terminal of the micro electro-mechanical film speaker SPK.

The DC bias voltage VB outputted by the DC bias voltage generator DRG may be equal to a sum of the common mode bias voltage VCM and a first voltage. As a result, the voltage difference between the voltage of the positive terminal of the micro electro-mechanical film speaker SPK and the voltage of the negative terminal of the micro electro-mechanical film speaker SPK is equal to the first voltage. The DC bias voltage generator DRG may adjust the first voltage according to characteristics of the micro electro-mechanical film speaker SPK.

The common mode bias voltage VCM of the first output terminal POP of the operational amplifier OPA is equal to that of the second output terminal PON of the operational amplifier OPA. In other words, a DC bias voltage of the first output terminal POP of the operational amplifier OPA is equal to that of the second output terminal PON of the operational amplifier OPA and is equal to the common mode bias voltage VCM, which is represented by the following equation:

VOP=VON=VCM, wherein VOP represents a signal of the first output terminal POP of the signal amplifier circuit SAC, VON represents a signal of the second output terminal PON of the operational amplifier OPA, and VCM represents the common mode bias voltage.

For example, as shown in FIGS. 3 and 4, the common mode bias voltage VCM is lower than a positive power supply voltage VP received by a positive power terminal of the operational amplifier OPA, and is higher than a negative power supply voltage VG received by a negative power terminal of the operational amplifier OPA. The common mode bias voltage VCM may be half a sum of the positive power supply voltage VP and the negative power supply voltage VG, which is represented by the following equation:

VCM=(VP+VG)/2, wherein VCM represents the common mode bias voltage, VP represents the positive power supply voltage VP and VG represents the negative power supply voltage.

If necessary, as shown in FIG. 2, a third input terminal of the operational amplifier OPA may receive the common mode bias voltage VCM. The common mode bias voltage VCM is lower than the positive power supply voltage VP received by the positive power terminal of signal amplifier circuit SAC, and is higher than the negative power supply voltage VG received by the negative power terminal of the signal amplifier circuit SAC.

A first terminal of the first feedback resistor R21 may be connected to the first input terminal of the operational amplifier OPA. A second terminal of the first feedback resistor R21 may be connected to a first terminal of (a feedback capacitor Cfb included in) the second high-pass filter HFR2 through the feedback terminal PFB of the signal amplifier circuit SAC. A second terminal of the feedback capacitor Cfb may be connected to the positive terminal of the micro electro-mechanical film speaker SPK and the second terminal of the output capacitor Cout.

A first terminal of the second feedback resistor R22 may be connected to the second input terminal of the operational amplifier OPA. A second terminal of the second feedback resistor R22 may be connected to the second output terminal PON of the signal amplifier circuit SAC. A resistance of the second feedback resistor R22 is equal to that of the first feedback resistor R21.

The DC bias voltage of the micro electro-mechanical film speaker SPK is equal to a voltage difference between a DC bias voltage of the positive terminal of the micro electro-mechanical film speaker SPK and a DC bias voltage of the negative terminal of the micro electro-mechanical film speaker SPK, which is represented by the following equation:

Vspk=VB−VCM, wherein, VB represents the DC bias voltage that is outputted the positive terminal of the micro electro-mechanical film speaker SPK from the DC bias generator DRG, and VCM represents the common mode bias voltage.

When the first input resistor SAC receives the AC input signal SIN, an AC signal at two terminals of the micro electro-mechanical film speaker SPK is represented by the following equation:

Vspk=−SIN×(R21/R11)=(VOP−VON)×Cratio1, wherein Vspk represents the AC signal at the two terminals of the micro electro-mechanical film speaker SPK, SIN represents the AC input signal, R21 represents the first feedback resistor, R11 represents the first resistor, VOP represents the signal at the first output terminal POP of the operational amplifier OPA, VON represents the signal at the second output terminal PON of the operational amplifier OPA, and Cratio1 represents a voltage dividing coefficient.

The voltage dividing coefficient Cratio1 is represented by the following equation:

Cratio1=Cout/(Cout+Cspk), wherein Cratio1 represents the voltage dividing coefficient, Cout represents a capacitance of the output capacitor Cout included in the first high-pass filter HFR1, and Cspk represents a capacitance of the micro electro-mechanical film speaker SPK.

An AC signal at the feedback terminal PFB of the operational amplifier OPA is the same as an AC signal at the positive terminal of the micro electro-mechanical film speaker SPK. An AC signal at the second output terminal PON of the operational amplifier OPA is the same as an AC signal at the negative terminal of the micro electro-mechanical film speaker SPK.

Figure 5:
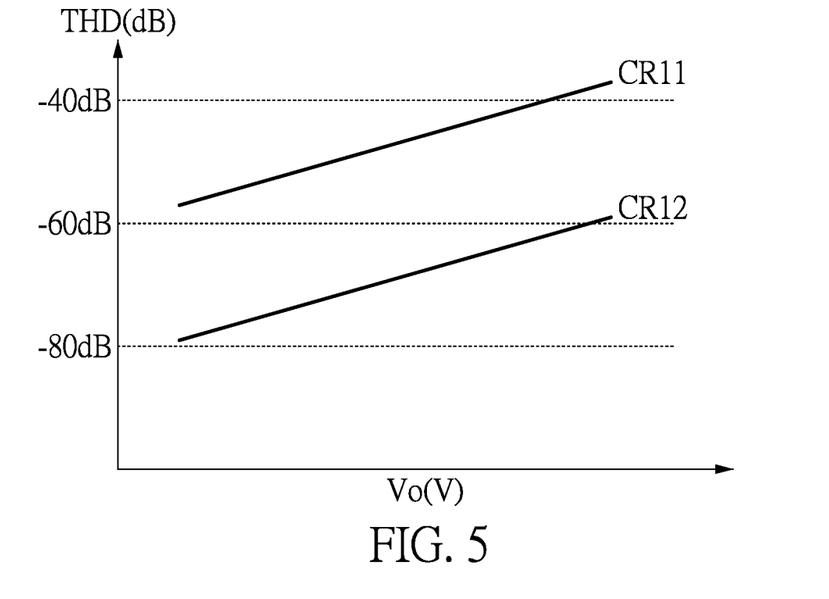
FIG. 5 is a diagram of curves of total harmonic distortion of signals to output voltages in the micro electro-mechanical film speaker device of the embodiment of the present disclosure and in a conventional micro electro-mechanical film speaker device.
Figure 6:
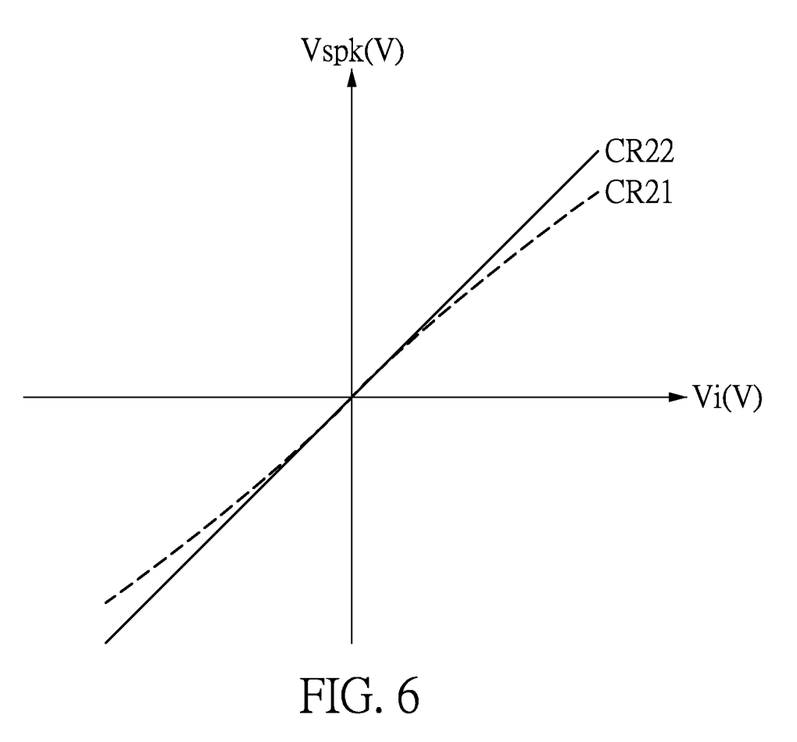
FIG. 6 is a diagram of a curve of a voltage of an AC signal at two terminals of a micro electro-mechanical film speaker of the embodiment of the present disclosure to a voltage of an AC input signal and a curve of a voltage of an AC signal at two terminals of the conventional micro electro-mechanical film speaker to the voltage of the AC input signal.

Reference is made to FIGS. 1 to 6, in which FIG. 5 is a diagram of curves of total harmonic distortion of signals to output voltages in the micro electro-mechanical film speaker device of the embodiment of the present disclosure and in a conventional micro electro-mechanical film speaker device, and FIG. 6 is a diagram of a curve of a voltage of an AC signal at two terminals of a micro electro-mechanical film speaker of the embodiment of the present disclosure to a voltage of an AC input signal and a curve of a voltage of an AC signal at two terminals of the conventional micro electro-mechanical film speaker to the voltage of the AC input signal.

As shown in FIG. 5, a curve CR11 represents the curve of the total harmonic distortion of the signal at the two terminals of the conventional micro electro-mechanical film speaker to the output voltage of the conventional micro electro-mechanical film speaker. A curve CR12 represents the curve of the total harmonic distortion of the signal at the two terminals of the micro electro-mechanical film speaker SPK of the embodiment of the present disclosure to the output voltage of the micro electro-mechanical film speaker SPK of the embodiment of the present disclosure. It is apparent that, the total harmonic distortion of the micro electro-mechanical film speaker device of the embodiment of the present disclosure is smaller than the total harmonic distortion of the conventional micro electro-mechanical film speaker device.

As shown in FIG. 6, a curve CR21 represents the curve of an amplitude Vspk of the AC signal at the two terminals of the conventional micro electro-mechanical film speaker to an amplitude Vi of the AC input signal. A curve CR22 represents the curve of the amplitude Vspk of the AC signal at the two terminals of the micro electro-mechanical film speaker SPK shown in FIG. 1 of the embodiment of the present disclosure to the amplitude Vi of the AC input signal.

The amplitude Vspk of the AC signal at the two terminals of the micro electro-mechanical film speaker SPK is substantially amplified by a gain and an error in the amplified amplitude Vspk is small, regardless of a value of the amplitude Vi of the AC input signal. As shown in FIG. 6, it is apparent that a linearity of the curve CR22 is greater than a linearity of the curve CR21.

In summary, the present disclosure provides the micro electro-mechanical film speaker device, which has the following characteristics:

the voltages of the two terminals of the micro electro-mechanical film speaker are feedbacked and the distortion in the signals of the micro electro-mechanical film speaker device is effectively improved based on the feedbacked voltage;

the signals feedbacked from the two terminals of the micro electro-mechanical film speaker is amplified by a constant gain, the signals are not attenuated by a voltage driver circuit, and thus the capacitance of the output capacitor included in the first high-pass filter does not need to be much larger than the capacitance of the micro electro-mechanical film speaker, thereby reducing a size of the output capacitor;

the second feedback capacitor included in the second high-pass filter filters the DC bias voltages and only allows the AC signal to be transmitted to the positive terminal of the micro electro-mechanical film speaker; and the DC bias voltage is determined according to the common mode bias voltage and provided to the positive terminal of the micro electro-mechanical film speaker such that the DC bias voltage between the two terminals of the micro electro-mechanical film speaker is constant.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A micro electro-mechanical film speaker device, comprising:
   a micro electro-mechanical film speaker;
   a signal amplifier circuit having a signal input terminal, a first output terminal, a second output terminal and a feedback terminal, wherein the signal input terminal of the signal amplifier circuit is connected to an external input circuit, the second output terminal of the signal amplifier circuit is connected to a negative terminal of the micro electro-mechanical film speaker, the signal amplifier circuit is configured to amplify an alternating current (AC) input signal from the external input circuit to output a first amplified signal through the first output terminal of the signal amplifier circuit, and the signal amplifier circuit outputs a second amplified signal to the negative terminal of the micro electro-mechanical film speaker through the second output terminal of the signal amplifier circuit;
   a first high-pass filter, wherein a first terminal of the first high-pass filter is connected to the first output terminal of the signal amplifier circuit, a second terminal of the first high-pass filter is connected to a positive terminal of the micro electro-mechanical film speaker, and the first high-pass filter is configured to filter the first amplified signal to output a first filtered signal to the micro electro-mechanical film speaker; and
   a second high-pass filter, wherein a first terminal of the second high-pass filter is connected to the feedback terminal of the signal amplifier circuit, a second terminal of the second high-pass filter is connected to the positive terminal of the micro electro-mechanical film speaker, and the second high-pass filter is configured to filter the first filtered signal to output a second filtered signal to the feedback terminal of the signal amplifier circuit.

2. The micro electro-mechanical film speaker device according to claim 1, further comprising:
   a direct current (DC) bias generator connected to the positive terminal of the micro electro-mechanical film speaker, wherein the DC bias generator is configured to output a DC bias voltage to the positive terminal of the micro electro-mechanical film speaker such that a difference is between a voltage of the positive terminal of the micro electro-mechanical film speaker and a voltage of the negative terminal of the micro electro-mechanical film speaker.

3. The micro electro-mechanical film speaker device according to claim 1, wherein the signal amplifier circuit includes:
   a first input resistor, wherein a first terminal of the first input resistor is connected to the external input circuit, and the signal input terminal of the signal amplifier circuit includes the first terminal of the first input resistor;
   a second input resistor, wherein a first terminal of the second input resistor is connected to the external input circuit, and the signal input terminal of the signal amplifier circuit includes the first terminal of the second input resistor;
   an operational amplifier, wherein a first input terminal of the operational amplifier is connected to a second terminal of the first input resistor, a second input terminal of the operational amplifier is connected to a second terminal of the second input resistor, the first output terminal of the operational amplifier is connected to the first terminal of the first high-pass filter, and the second output terminal of the operational amplifier is connected to the negative terminal of the micro electro-mechanical film speaker;
   a first feedback resistor, wherein a first terminal of the first feedback resistor is connected to the first input terminal of the operational amplifier, and a second terminal of the first feedback resistor is connected to the first terminal of the second high-pass filter through the feedback terminal; and
   a second feedback resistor, wherein a first terminal of the second feedback resistor is connected to the second input terminal of the operational amplifier, and a second terminal of the second feedback resistor is connected to the second output terminal of the operational amplifier.

4. The micro electro-mechanical film speaker device according to claim 3, wherein the first high-pass filter includes an output capacitor, a first terminal of the output capacitor is connected to the first output terminal of the operational amplifier, and a second terminal of the output capacitor is connected to the positive terminal of the micro electro-mechanical film speaker.

5. The micro electro-mechanical film speaker device according to claim 3, wherein the second high-pass filter includes a feedback capacitor, a first terminal of the feedback capacitor is connected to the second terminal of the first feedback resistor, and a second terminal of the feedback capacitor is connected to the positive terminal of the micro electro-mechanical film speaker.

6. The micro electro-mechanical film speaker device according to claim 3, wherein a common mode bias voltage of a signal outputted by the first output terminal of the operational amplifier is the same as that of a signal outputted by the second output terminal of the operational amplifier.

7. The micro electro-mechanical film speaker device according to claim 6, wherein the common mode bias voltage is lower than a positive power supply voltage received by a positive power terminal of the operational amplifier, and is higher than a negative power supply voltage received by a negative power terminal of the operational amplifier.

8. The micro electro-mechanical film speaker device according to claim 6, wherein a third input terminal of the operational amplifier receives the common mode bias voltage.

9. The micro electro-mechanical film speaker device according to claim 6, wherein the common mode bias voltage is half a sum of the positive power supply voltage and the negative power supply voltage.

10. The micro electro-mechanical film speaker device according to claim 6, wherein the DC bias voltage generator determines the DC bias voltage according to the common mode bias voltage and then outputs the DC bias voltage.

11. The micro electro-mechanical film speaker device according to claim 6, wherein the DC bias voltage outputted by the DC bias voltage generator is equal to a sum of the common mode bias voltage and a first voltage, and a difference between a voltage of the positive terminal of the micro electro-mechanical film speaker and a voltage of the negative terminal of the micro electro-mechanical film speaker is a constant value that is equal to the first voltage.

12. The micro electro-mechanical film speaker device according to claim 11, wherein the DC bias voltage generator adjusts the first voltage according to characteristics of the micro electro-mechanical film speaker.

* * * * *